(12) United States Patent
Goto et al.

(10) Patent No.: US 6,497,013 B1
(45) Date of Patent: Dec. 24, 2002

(54) CABINET SUPPORT PLATFORM

(75) Inventors: Teiyu Goto, Tokyo (JP); Takayuki Soga, Tokyo (JP)

(73) Assignee: Sony Computer Entertainment, Inc., Tokyo (JP)

( * ) Notice: Subject to any disclaimer, the term of this patent is extended or adjusted under 35 U.S.C. 154(b) by 0 days.

(21) Appl. No.: 09/659,496

(22) Filed: Sep. 11, 2000

(51) Int. Cl.⁷ .................................................. F16M 1/00
(52) U.S. Cl. .......................... 24/346.01; 248/346.04; 248/346.07; 248/918; 312/223.1; 312/223.2; D14/447
(58) Field of Search .......................... 248/346.01, 918, 248/346.07, 346.04, 188.1; 312/223.1, 223.2; 361/686, 679, 683, 681, 684, 685; D14/447; D6/491, 449

(56) References Cited

FOREIGN PATENT DOCUMENTS

| JP | 05-266643 | 10/1993 |
|---|---|---|
| JP | 06-350276 | 12/1994 |
| JP | 2001-68864 | 3/2001 |

*Primary Examiner*—Anita King
*Assistant Examiner*—Deborah M. Brann
(74) *Attorney, Agent, or Firm*—Katten Muchin Zavis Rosenman

(57) ABSTRACT

A cabinet support platform which supports a cabinet of an electronic device and the like has a base plate which receives a base surface of the cabinet. Two side support members which support side faces of the cabinet and stoppers are provided on the inside of the side support members. The stoppers are attached to the side support members to tightly grip and hold the side surfaces of the cabinet by tight contact with the cabinet surfaces.

13 Claims, 14 Drawing Sheets

CABINET SUPPORT PLATFORM

BACKGROUND OF THE INVENTION

1. Field of the Invention

This invention relates to a cabinet support platform that supports a cabinet of an electronic device, etc. and prevents it from toppling.

2. Description of Prior Art

In recent years, personal computers, external memory devices, and other electronic devices have been made so that a cabinet can be set up in either a vertical or horizontal orientation. In the vertical orientation, a cabinet support platform is sometimes used to keep it from toppling over.

Among cabinet support platforms of this type, as the first previous known example, there is one that consists of a set of members having clamping pieces for sandwiching in and holding both sides of the cabinet and a setting surface on which the cabinet is to be set, and in which these members are fastened together by screws (for example, patent H5-266643 [1993]).

In another conventional example, the cabinet consists of a set of members having a holding part that clamps and holds both sides of the cabinet, a protruding part on which the cabinet is to be set, and legs, and in which these members are joined rotatably to each other (patent H6-350276 [1994]).

However, with the cabinet support platform of the first conventional example, the members are fastened together by screws, and the spacing between the clamping pieces must be adjusted to fit the width of the cabinet, which makes the work of putting it together complicated.

With the second above described conventional example there is the problem that the structure is complicated, because the members are joined rotatably.

SUMMARY OF THE INVENTION

It is an object of the present invention, which was conceived in order to solve the above problems, to provide a cabinet support platform whose structure and assembly are simple and that supports the cabinet in a more stable condition.

The above and other objects of the present invention are attained by a cabinet support platform that supports the cabinet of an electronic device, etc., and comprises a base plate that supports a base surface of said cabinet, two side support members that are provided on both side ends of said base plate and that each supports a side face of said cabinet, and stoppers that protrude on at least one inside surface of said side support members and are attached so as to make a tight contact with the side surfaces of said cabinet.

In an embodiment, a cabinet support platform that supports the cabinet of an electronic device, etc. comprises a base plate that supports a base surface of said cabinet and two side support members that are provided on both side ends of said base plate and that each supports a side face of said cabinet, wherein said side support members are each formed in the shape of an angular pillar on a side.

In another embodiment, a cabinet support platform that supports the cabinet of an electronic device, etc., comprises a base plate that supports a base surface of said cabinet, a ;protective member that is provided on the front end of said base plate and protects the front part of said cabinet, and protruding members that are provided on said base plate surface and fit into depressions formed in the base surface of said cabinet.

DETAILED DESCRIPTION OF THE PREFERRED EMBODIMENT

Figure 1:
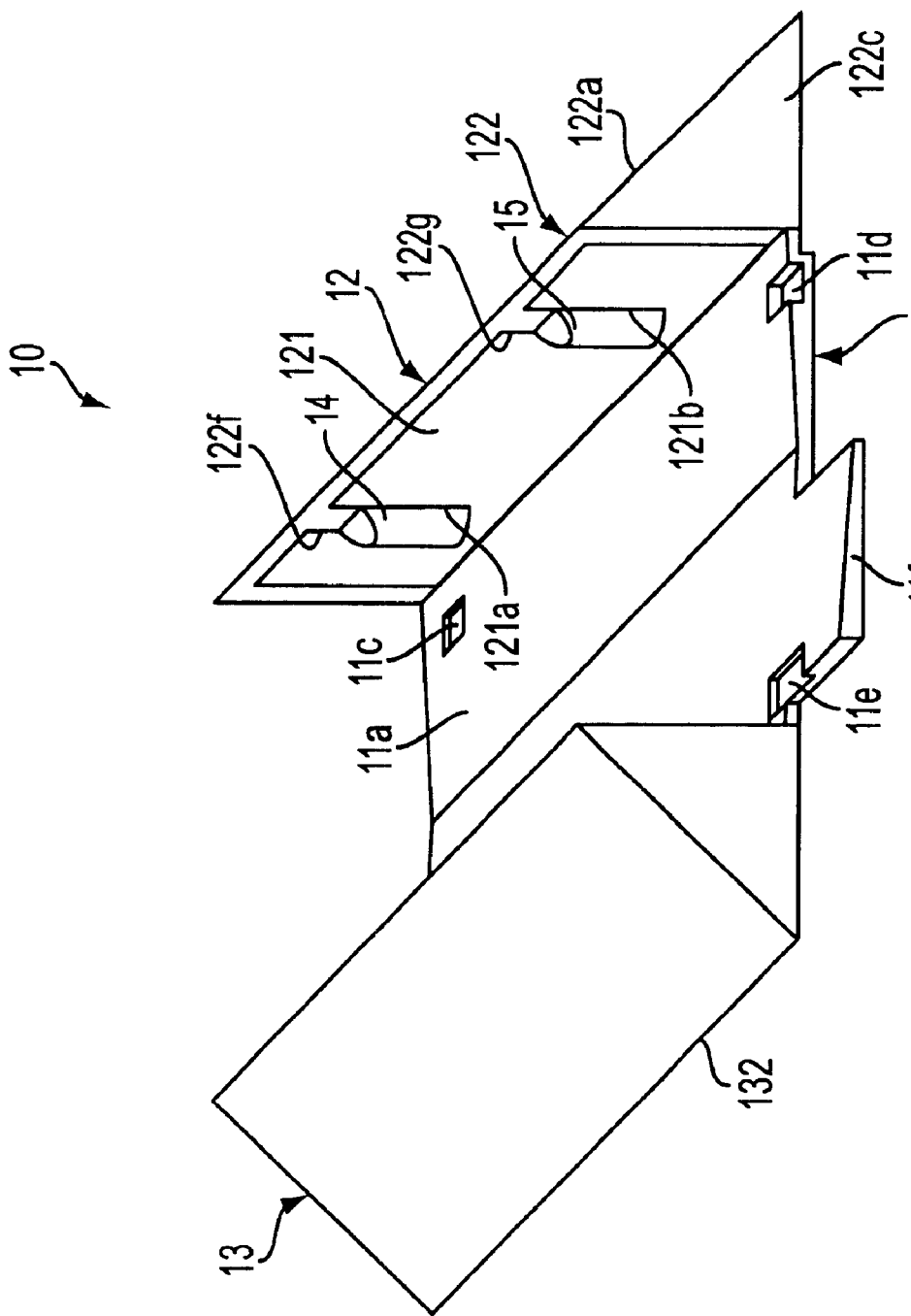
FIG. 1 is a perspective view of the stand of a first embodiment of this invention.

An electronic device 1 is, for example, an entertainment device that executes games, etc. The cabinet of electronic device 1 consists mainly of an upper cabinet part 2 and a lower cabinet part 3, and it is designed so that the lower cabinet part 3 is somewhat smaller than upper cabinet part 2. Provided on upper cabinet part 2 are a power switch 2a, a switch 2b, a disk tray 2c, memory card slots 2d, 2e, and controller slots 2f, 2g, etc.

Disk tray 2c is of a forward-sliding structure, and by pressing the disk tray switch 2b, one gives instruction for the pullout operation and the put-in operation. Controllers for game operation are connected to controller slots 2f, 2g. Memory cards for recording game data, etc. corresponding to the controllers connected to controller slots 2f, 2g are mounted in memory card slots 2d, 2e, respectively.

Figure 3:
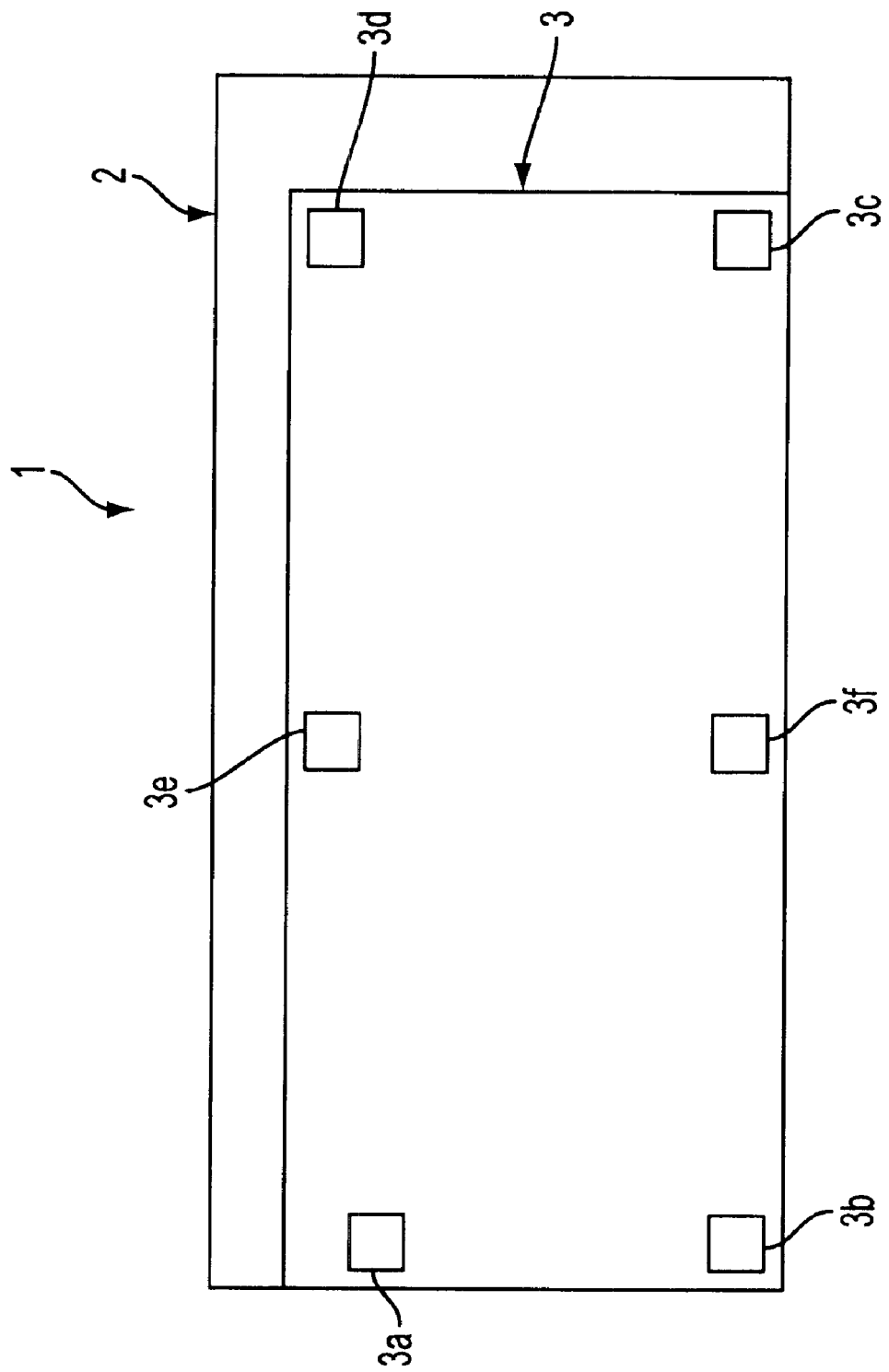
FIG. 3 diagrammatically shows a base surface of the electronic device of FIG. 2.

As shown in FIG. 3, six legs 3a, 3b, 3c, 3d, 3e, 3f consisting of elastic material such as rubber are attached to the base of the lower cabinet part 3. Among these legs, legs 3a, 3b, 3c, 3d can easily be removed.

Figure 4:
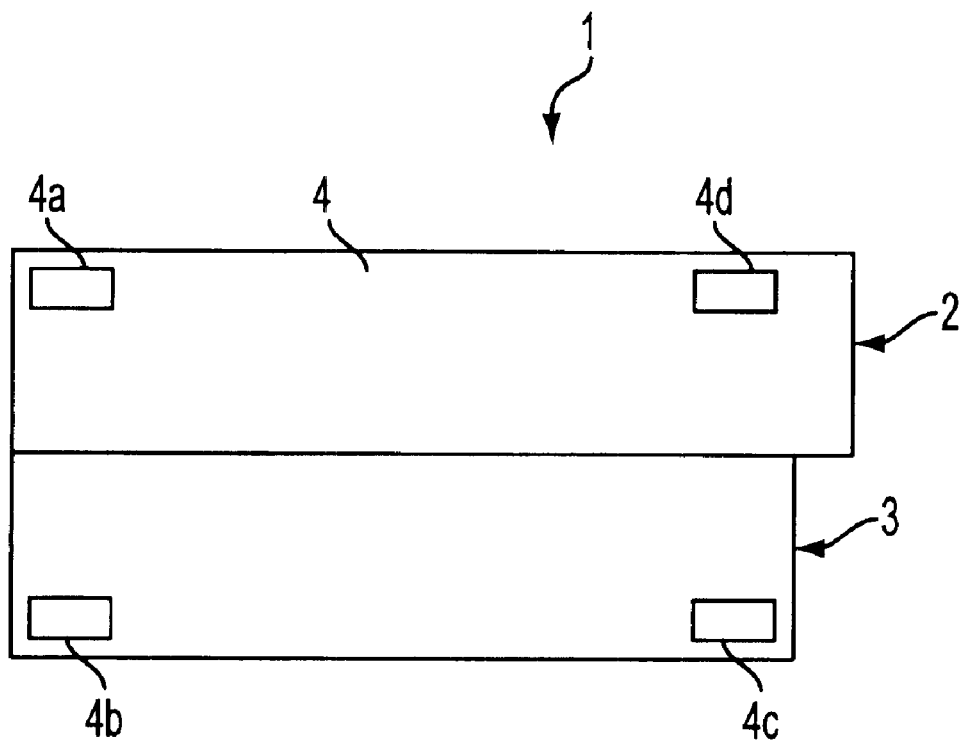
FIG. 4 is a side view seen from the direction of arrow X in FIG. 2.

As shown in FIG. 4, legs 4a, 4b, 4c, 4d for when the electronic device 1 is put into vertical orientation are attached to one side 4 of the electronic device 1. These legs 4a, 4b, 4c, 4d are formed by elastic members such as rubber.

Next the structure of the stand for supporting the electronic device 1 having such a cabinet structure in the vertical orientation.

Figure 5:
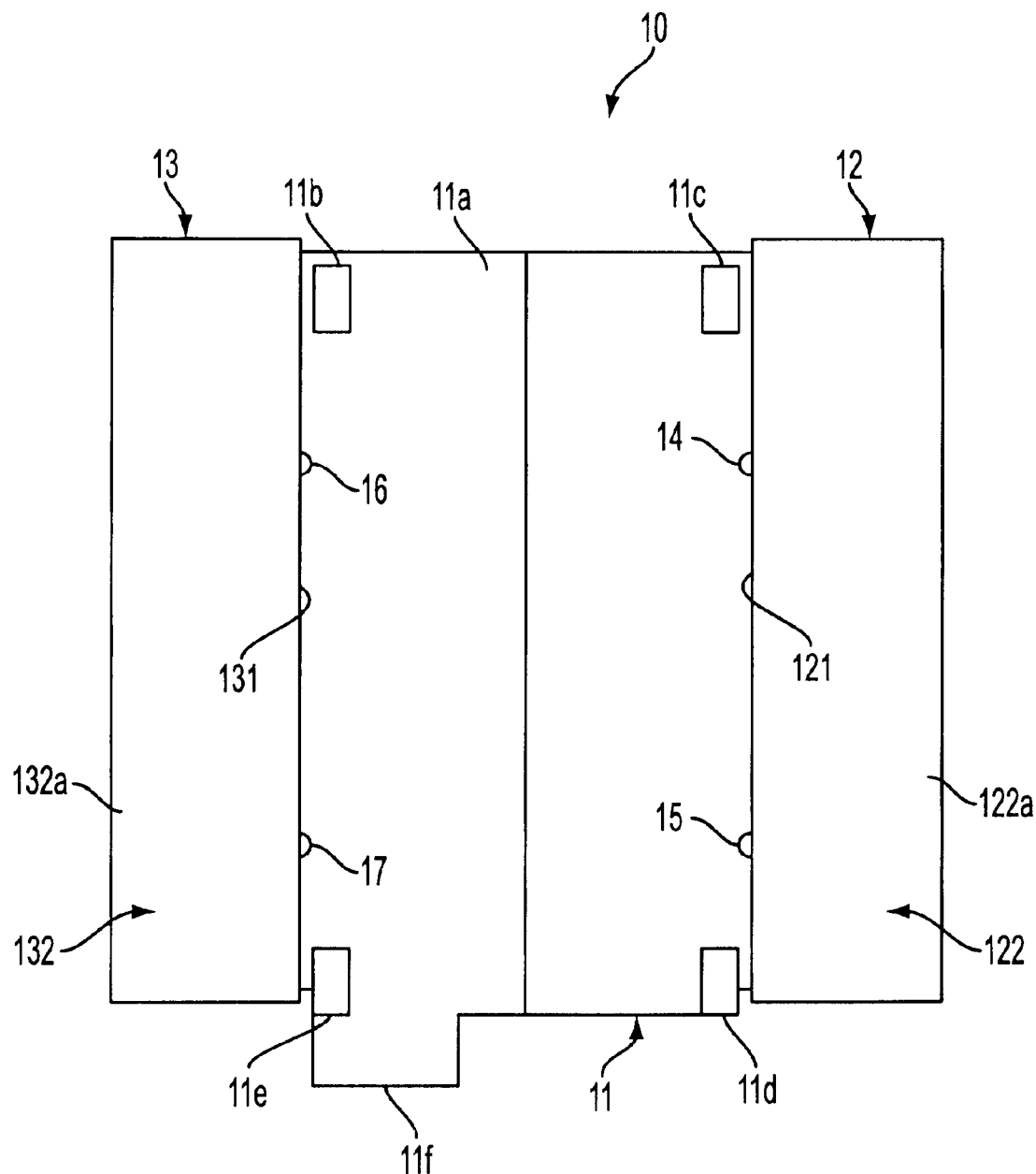
FIG. 5 is a plan view of the stand of the first embodiment of the invention.
Figure 6:
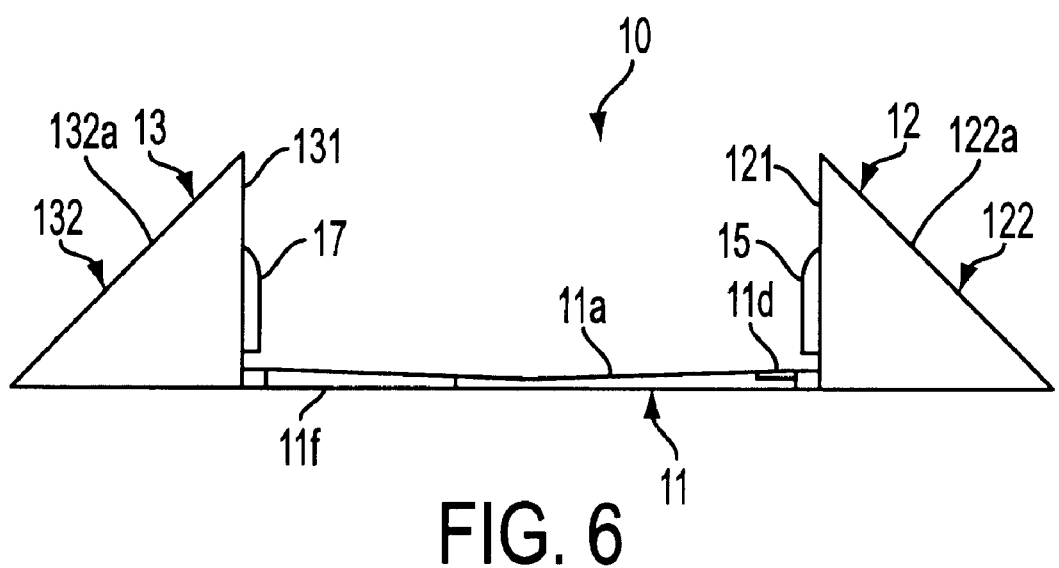
FIG. 6 is a front view of the stand of the first embodiment.

FIG. 1 is a perspective view of the stand of the first embodiment, FIG. 5 is a plan view of the stand of the first embodiment, and FIG. 6 is a front view of the stand of the first embodiment.

Stand 10 serving as a cabinet support platform consists mainly of a base plate 11 and left and right side support members 12, 13. These are made mainly of, for example, synthetic resin.

Base plate 11 is formed so that its cross-sectional shape forms roughly a V shape. The electronic device 1 is placed in vertical orientation on its setting surface 11a. Depressions 1b, 1c, 1d, 1e are formed in the four corners of setting surface 11a. These depressions 11b, 11c, 11d, 11e are shaped so that legs 4a, 4b, 4c, 4d shown in FIG. 4 can fit into them, respectively.

A support piece 11f for supporting the protruding part of the upper cabinet part 2 on side surface 4 of electronic device 1 is formed on base plate 11 so as to protrude the prescribed amount on the front side.

Side support members 12, 13 are provided on the left and right sides, respectively, of such base plate 11. Side support members 12, 13, which are each shaped like a triangular pillar lying horizontally, support the side surfaces of electronic device 1 between support plate 121 and support plate 131, which are formed roughly perpendicularly to the base plate. Covers 122, 132, which have sloping faces 122a, 132a, respectively, are detachably attached to side support members 12, 13.

Stoppers 14, 15, 16, 17 consisting of elastic materials such as rubber are provided on support plates 121, 131 of side support member 12, 13 so as to protrude inwardly thereof Stoppers 14, 15 are attached by inserting each into slits formed in support plate 121. This specific attachment structure is described below. On the other side, stoppers 16 and 17 are similarly inserted into slits in support plate 131 that are not pictured.

Figure 7:
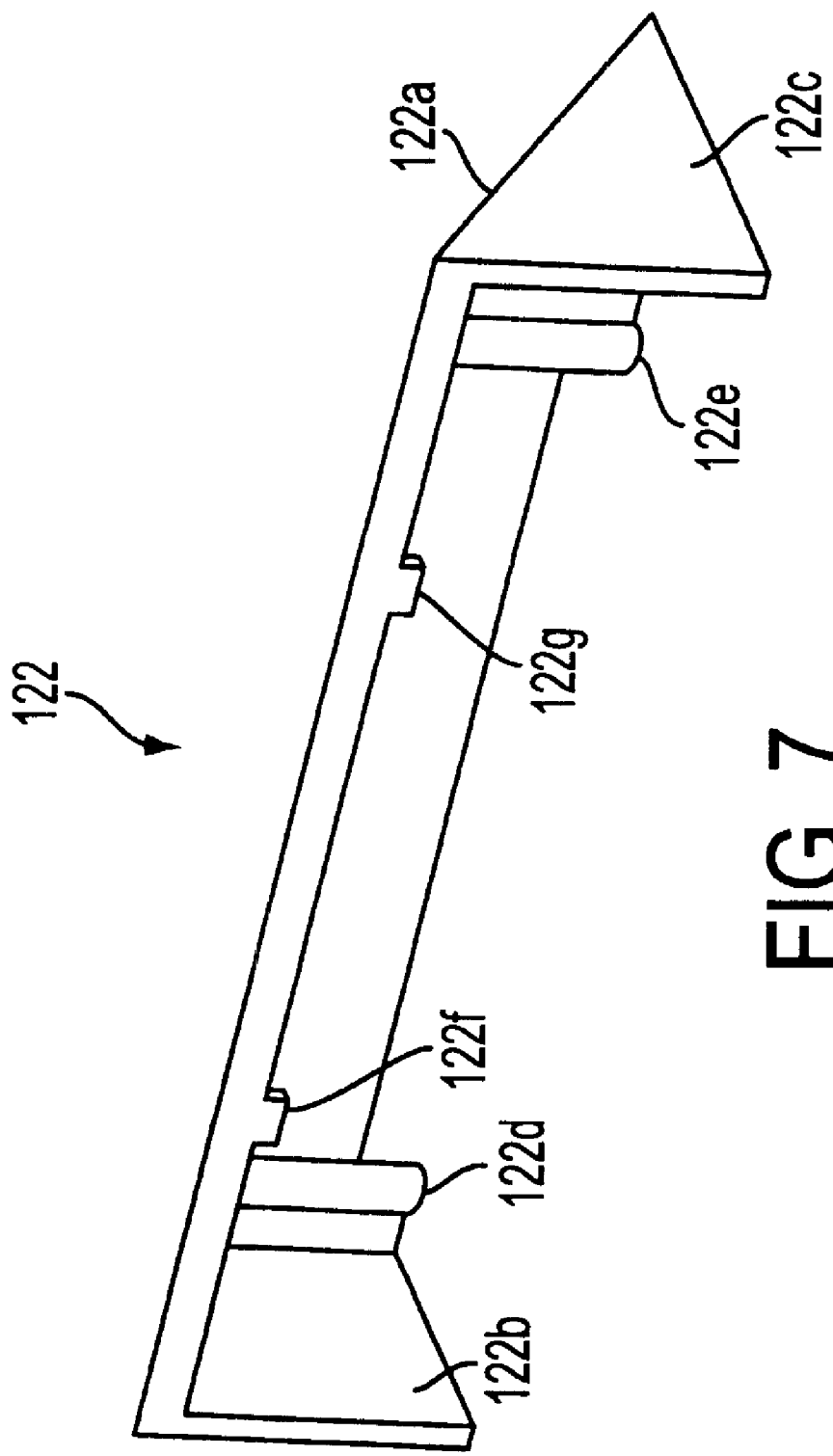
FIG. 7 is a perspective view of the cover of a side support member.

FIG. 7 is a perspective view showing the structure of cover 122 of the side support member 12. Cover 122 is generally formed by side plates 122b, 122c formed integrally with the sloping face 122a. Two bosses 122d, 122e for screw fastening are formed integrally on the inside of this cover 122. In addition, two protruding pieces 122f, 122g that extend downward are formed on the upper edge of cover 122. As shown in FIG. 1, the structure of protruding pieces 122f 122g is such that stoppers 14, 15 are pushed on from above with cover 122 attached.

Figure 8:
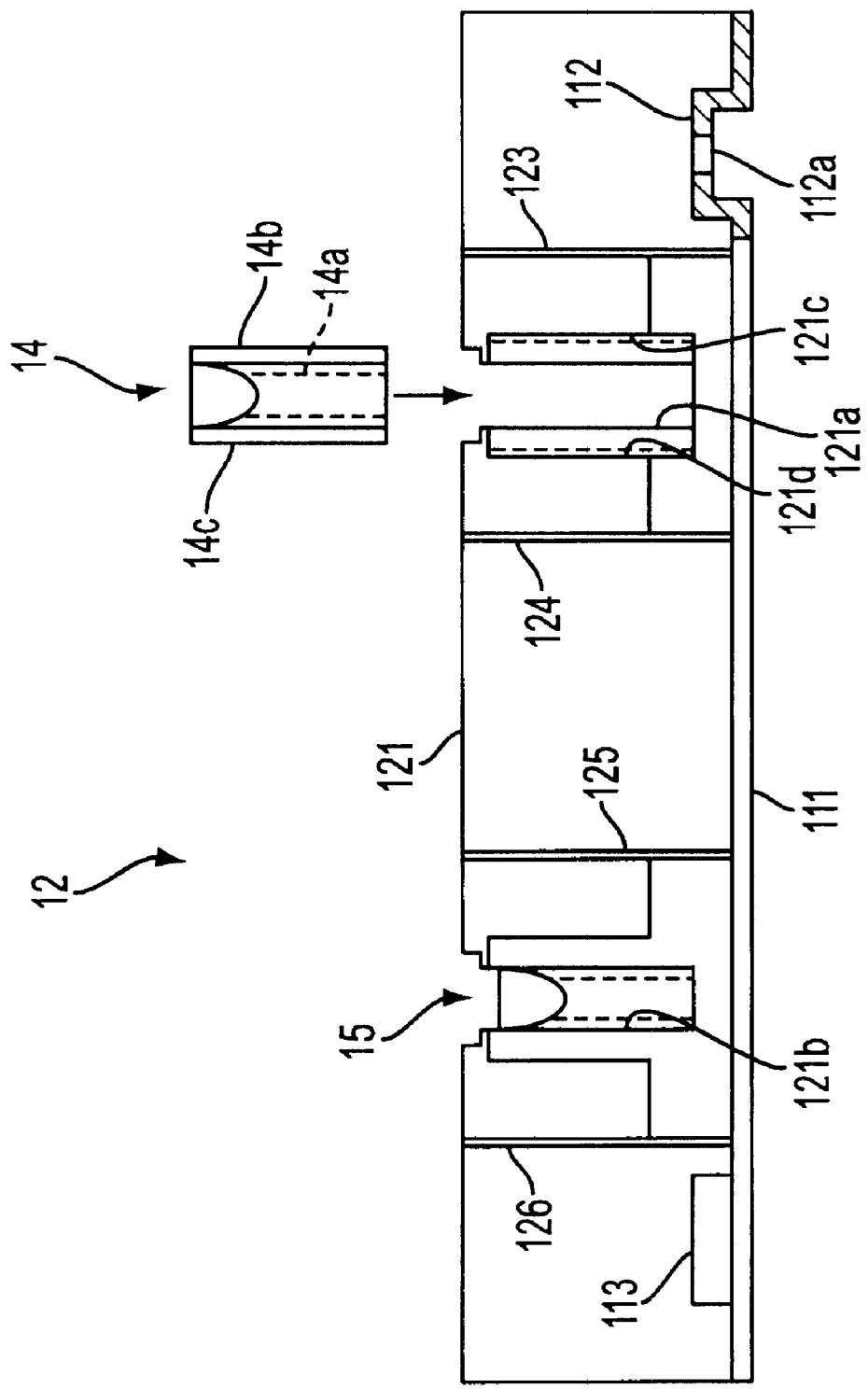
FIG. 8 is a side view of a side support member with its cover removed.

FIG. 8 is a side view showing the structure of side support member 12 with cover 122 removed. Shown in FIG. 8 is a side view as seen from the outside. Depressions 121c, 121d are formed in both sides of slit 121a. Stopper 14 is attached to slit 121a. Stopper 14 has fins 14b, 14c on both sides of body 14a, which is of roughly pillar shape. Stopper 14 is mounted in slit 121a by slide-inserting has 14b, 14c down into depressions 121c, 121d, respectively.

The structure on the side of slit 121b is the same as slit 121a, and this description thereof is omitted.

Base surface 111, which is shaped by extending the base plate 11, is provided on the side support member 12. Two attachment platforms 112, 113 are formed on base surface 111. Bosses 122d, 122e of cover 122 shown in FIG. 7 are placed on attachment platforms 112, 113, respectively. Hole 112a is formed in the middle of attachment platform 112, allowing a screw, (not shown), to be inserted from below. With such screw, boss 122d of cover 122 can be screwed to base surface 111. Similarly, attachment platform 113, by the same structure as attachment platform 112, allows boss 122e of cover 122 to be screwed to base surface 111.

Formed integrally between support plate 121 and base surface 111 are, for example, four ribs 123, 124, 125, 126. This increases the strength.

The structure of side support member 12 was described in connection with FIGS. 7 and 8, and the other side support member 13 has the same structure, so it is not described here.

Next, the manner of using stand 10 of the first embodiment having the above described composition will be described.

Figure 9:
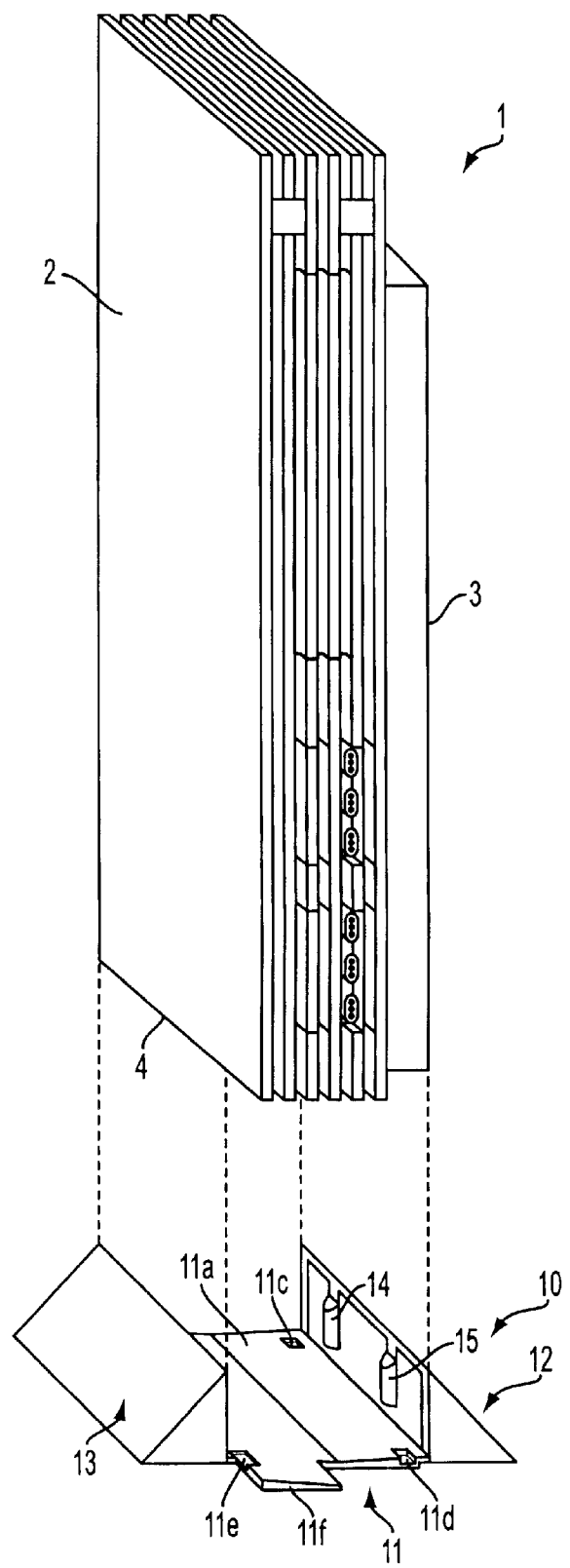
FIG. 9 is a diagram showing how to use the stand of the first embodiment of the invention.
Figure 10:
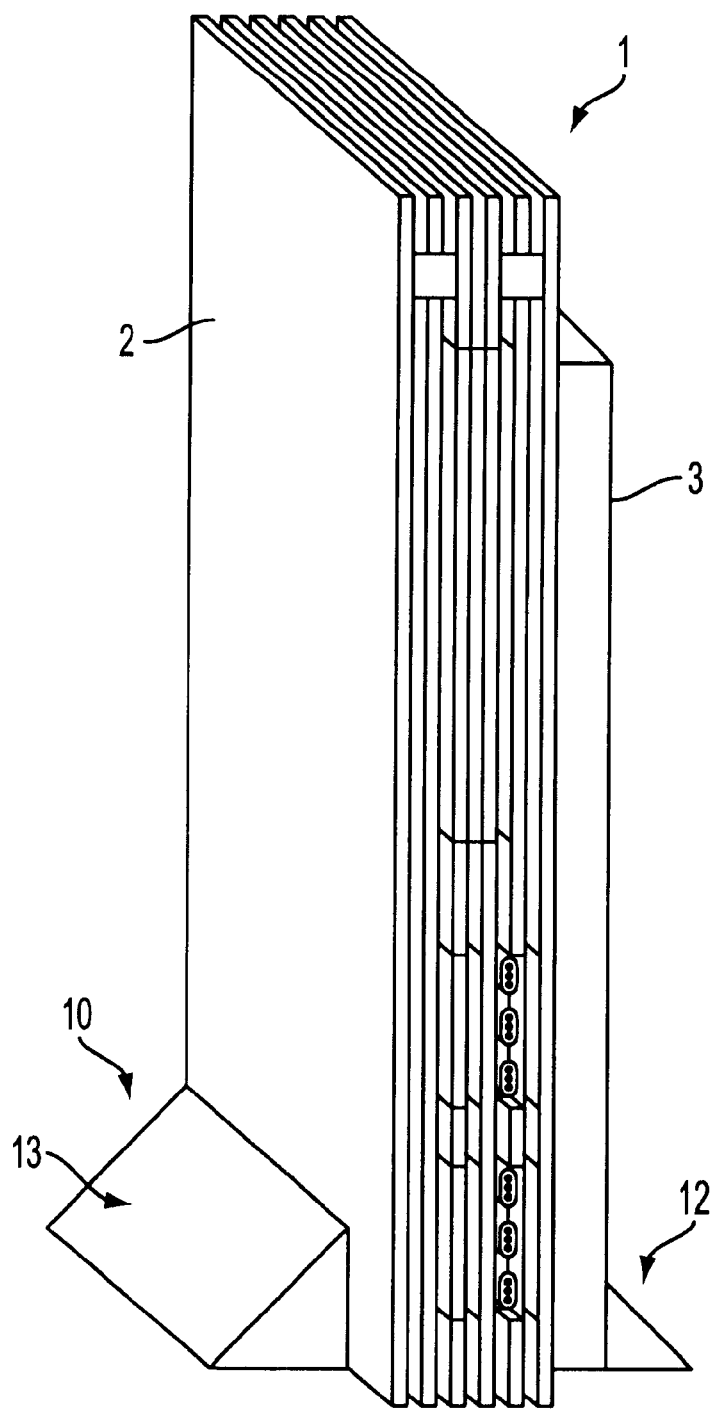
FIG. 10 is a perspective view showing the state in which an electronic device is mounted on the stand of the first embodiment.

FIG. 9 is a diagram showing how to use stand 10. Electronic device 1 is inserted between side support members 12, 13 with the side face 4 facing downward and the front side facing the side of support piece 11f of stand 10. At this time, positioning is done so that legs 4a, 4b, 4c, 4d of base surface 4 shown in FIG. 4 fit into depressions 11b, 11c, 11d, 1e of base plate 11, respectively. Thus electronic device 1 can be held in the vertical orientation by stand 10, as shown in FIG. 10.

At this time, tottering can be prevented, because stoppers 14–17 provided on the inside of side support members 12, 13 press the side faces of cabinets 2, 3 of electronic device 1 from both sides. Slipping can also be prevented, because legs 4a, 4b, 4c, 4d fit into depressions 11b, 11c, 11d, 11e in the base plate.

Because side support members 12, 13 are made in the shape of an angular pillar such as a triangular pillar, they can generally be matched to the design of a cabinet having many angles.

Next, the second embodiment of this invention will be described.

Figure 11:
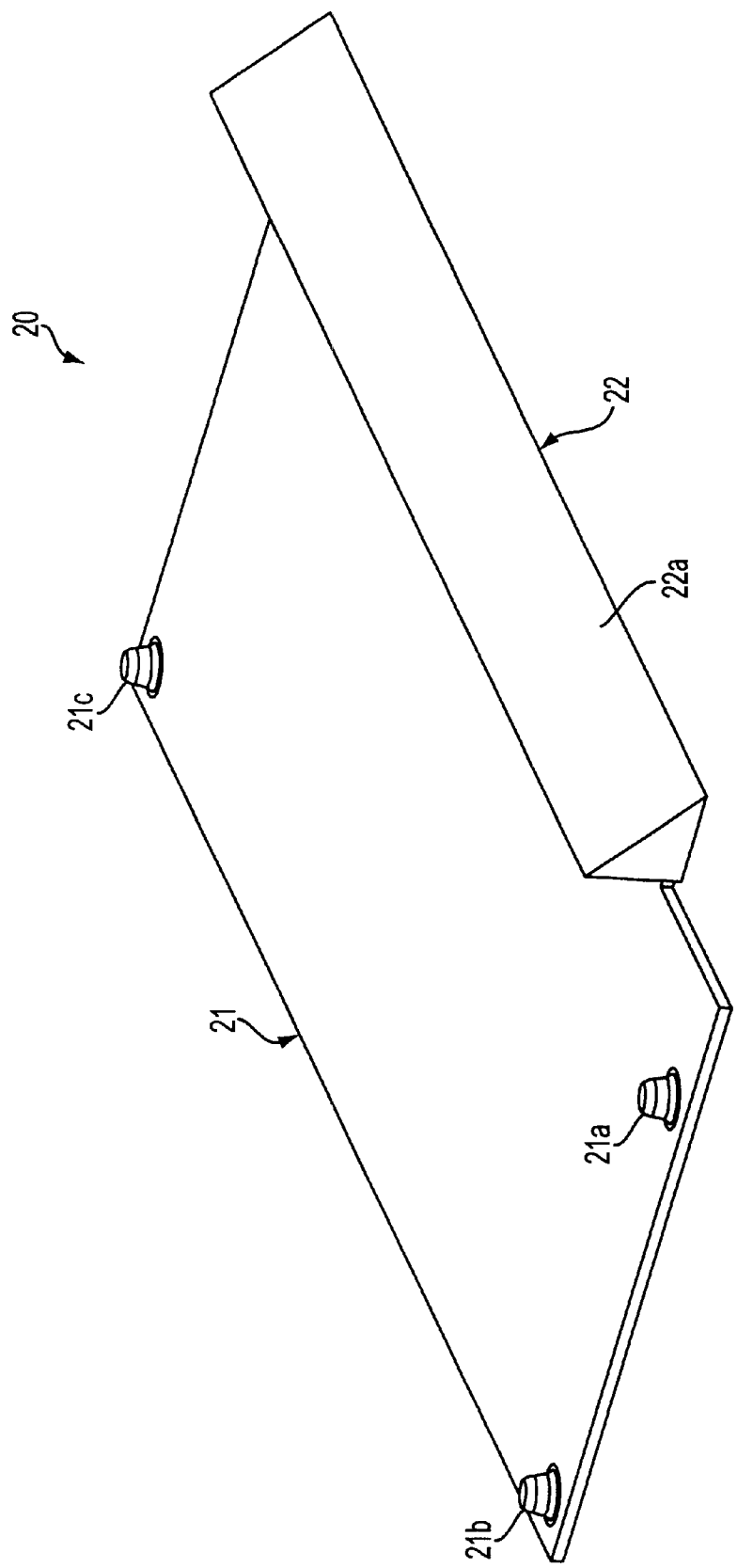
FIG. 11 is a perspective view of the stand of a second embodiment.
Figure 12:
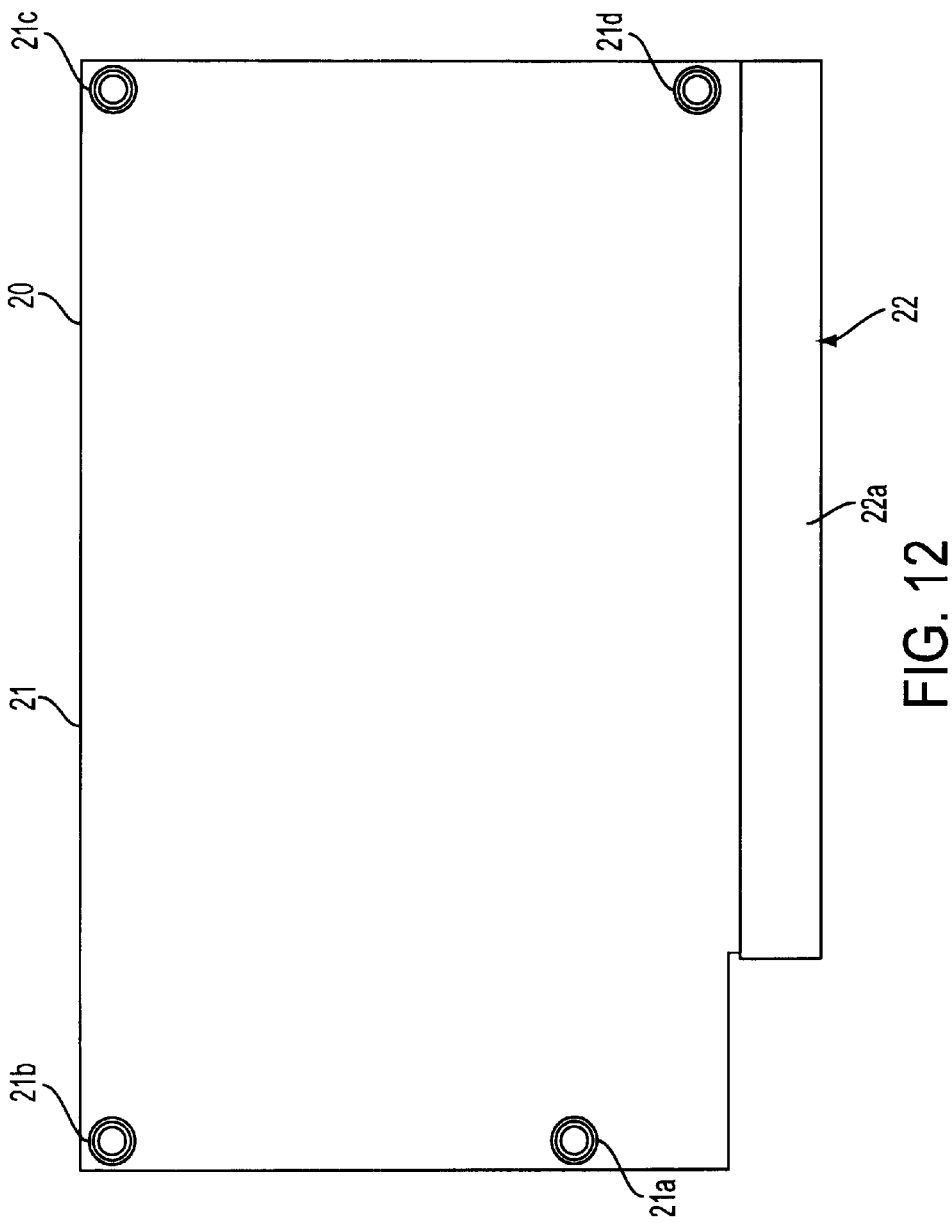
FIG. 12 is a plan view of the stand of FIG. 11.

FIG. 11 is a perspective view of the stand of the second embodiment, and FIG. 12 is a plan view of the stand of the second embodiment. Stand 20, which is a stand for horizontal orientation of the electronic device, consists of base a plate 21 and a front protective member 22 which are made substantially of a material such as, for example, synthetic resin.

Figure 2:
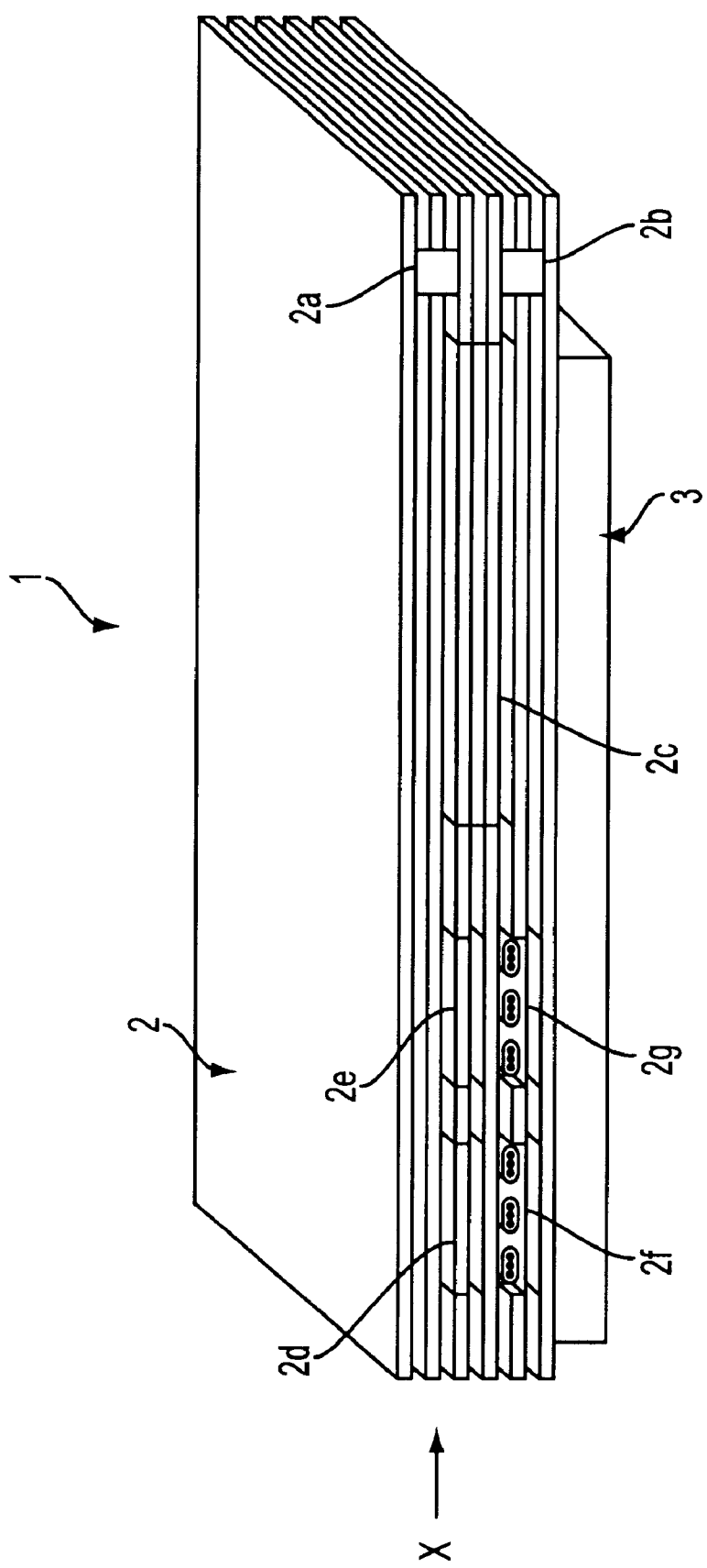
FIG. 2 is a perspective view of an electronic device in a horizontal orientation supported by the stand of the first embodiment of the present invention.

Base plate 21 is shaped so as to have roughly the same design as the base surface part of the lower cabinet 3 of electronic device 1 shown in FIG. 2. Provided on this base plate 21 are four protruding members 21a, 21b, 21c, 21d. The protruding members 21a, 21b, 21c, 21d are formed as elastic members of elastic material such as rubber. Also, protruding members 21a, 21b, 21c, 21d are shaped so as to be able to fit into holes, (not shown) after legs 3a, 3b, 3c, 3d of lower cabinet 3 of the electronic device 1 are removed, respectively.

Front protective member 22, which covers the front of electronic device 1, is provided detachably on the front side of base plate 21. This front protective member 22 has the shape of a triangular pillar on its side and is formed so that sloping face part 22a faces the front.

Figure 13:
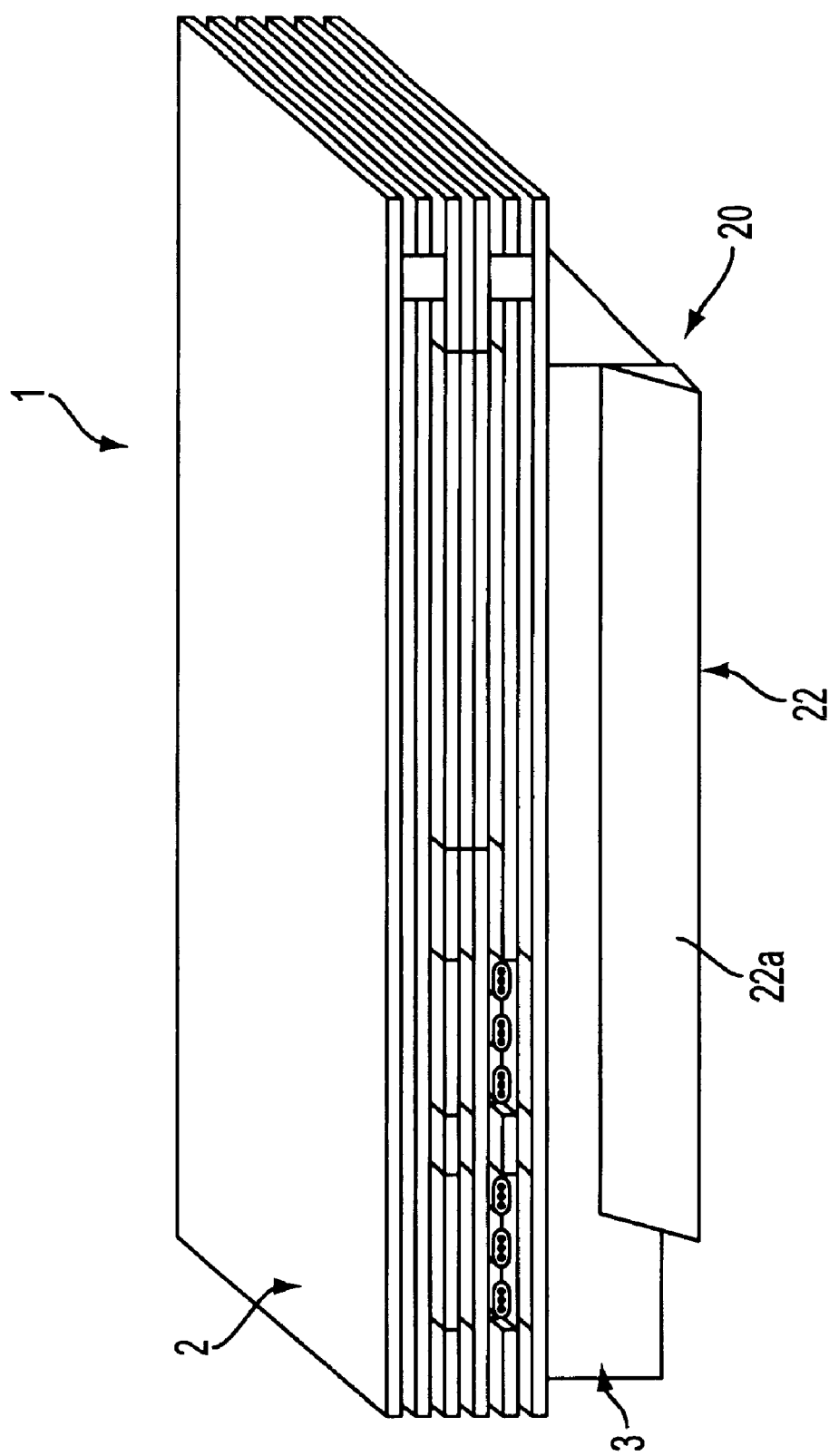
FIG. 13 is a perspective view showing the state in which an electronic device is attached to the stand of the second embodiment of the present invention.
Figure 14:
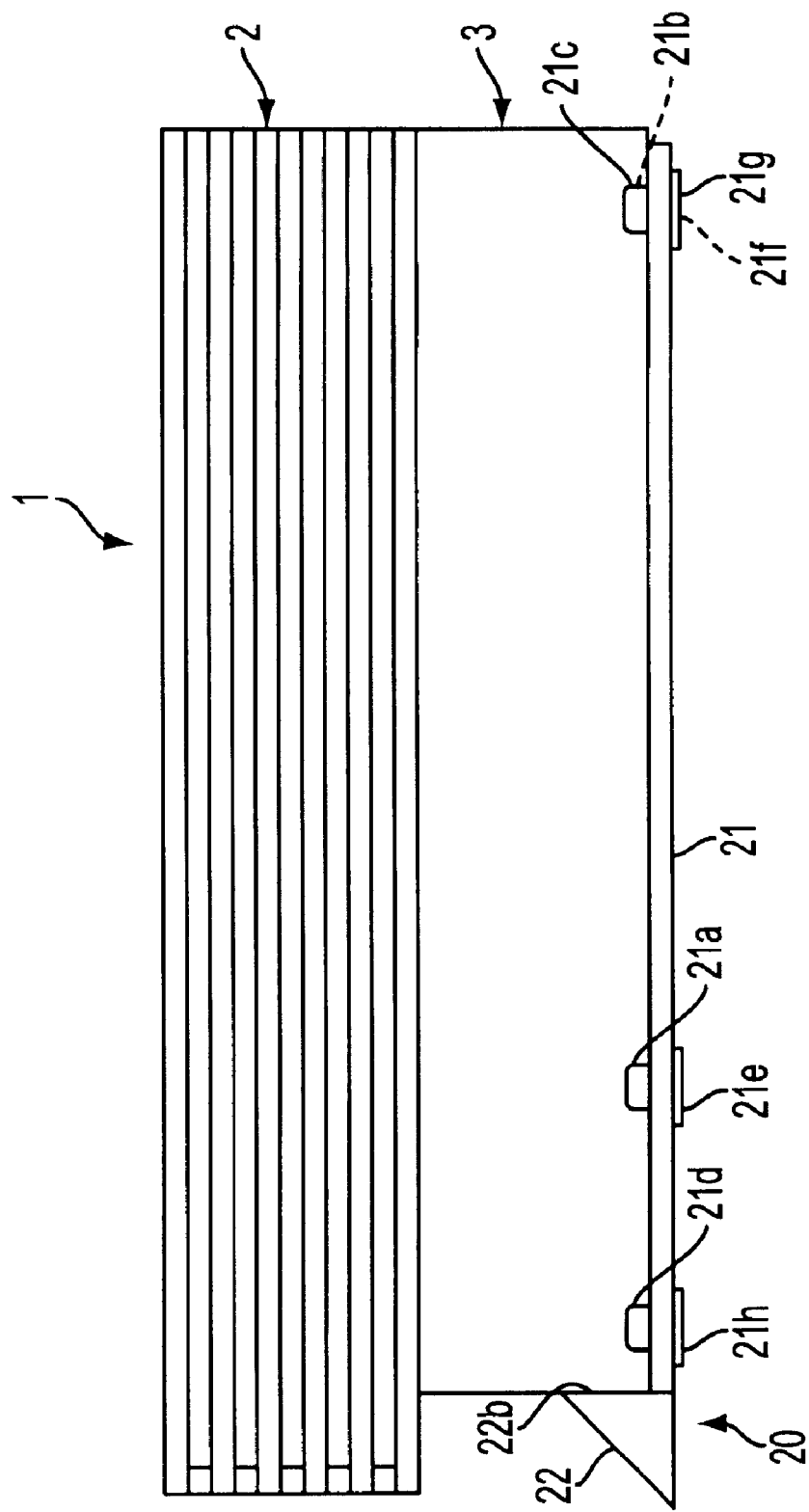
FIG. 14 is a side view showing the state in which an electronic device is attached to the stand of the second embodiment.

FIG. 13 is a perspective view showing the state in which electronic device 1 is attached to stand 20 of the second embodiment, and FIG. 14 is a side view thereof. If electronic device 1 is to be attached to stand 20, one removes legs 3a, 3b, 3c, 3d on the rear surface of lower cabinet 3, executes the positioning so that protruding members 21a, 21b, 21c, 21d fit into the holes, (not shown), into which these legs formerly fitted, and places electronic device 1 on the base plate 21. In this way, one can securely attach stand 20 to the electronic device 1.

At this time, as shown in FIG. 14, the front of the lower cabinet 3 can be protected by the inside surface 22b of the front protective member 22.

Because the front protective member 22 is made in the shape of an angular pillar such as a triangular pillar, it can generally be matched to the design of a cabinet having many angles.

In addition, as shown in FIG. 14, protruding members 21a, 21b, 21c, 21d and legs 21e, 21f, 21g, 21h of base plate 21 may be respectively formed integrally, and may be made in such as way as to fit into holes, (not shown), made in base plate 21. In this way the number of parts can be kept small and the number of manufacturing steps can be reduced.

What is claimed is:

1. A cabinet support platform adapted to support a cabinet of an electronic device, comprising;
    a base plate adapted to support a cabinet base surface, said base plate having opposite ends;
    two side support members that are provided on said opposite ends of said base plate, each of said side support members being adapted to support a cabinet side face, each of said side support members having an inside surface; and
    slidably detachable stoppers that protrude on at least one inside surface of said side support members and are attached to said support side members such that when a cabinet is supported by said cabinet support platform, said stoppers are adapted to make light contact with said cabinet.

2. The cabinet support platform as described in claim 1, wherein said side support members are formed in a shape of an angular pillar on a side thereof.

3. The cabinet support platform as described in claim 2, wherein said side support members have a cross-section which is a right triangle and are each provided with an inside surface, that is adapted to contact a support cabinet, and an outer sloping part.

4. The cabinet support platform as described in claim 3, wherein said outer sloping part of said side support members is detachable from said inside surface.

5. The cabinet support platform as described in claim 4, wherein slits are formed in said inside surface of each of said side support members, and said stoppers are mounted in said slits.

6. The cabinet support platform as described in claim 1, further comprising depressions formed in said base plate for accommodating a cabinet base surface.

7. A cabinet support platform, comprising:
    base plate having opposite ends; and
    a side support member provided on each of said opposite ends of said base plate;
    wherein each side support member is formed in a shape of an angular pillar on a side thereof;
    wherein each side support member further comprises an inside surface that is adapted to contact a cabinet supported in said cabinet support platform;
    wherein each side support member further comprises an outer pant that slopes away from said inside surface, said outer part being detachable from said base plate,
    wherein said side support members have a cross-section which is of a right triangle,
    wherein each said outer part is respectively engageable with each said inside surface of each side support member; and
    further comprising stoppers provided on at least one inside surface of said side support members.

8. A cabinet support platform adapted to support a cabinet of an electronic device, comprising:
    a base plate adapted to support a cabinet base surface, said base plate having a front edge and a contact surface,
    a front protective member provided on said front edge of said base plate for protecting the front of a cabinet supported on said platform, and
    elastic protruding members that are provided on said contact surface of said base plate and are adapted to fit into depressions formed in a cabinet base surface,
    wherein said protruding members are formed integrally with feet that support a rear surface of said base plate and are attached by fitting into holes formed in said base plate.

9. A cabinet support platform adapted to support a cabinet of an electronic device, comprising:
    a base plate adapted to support a cabinet base surface, said base plate having a front edge and a contact surface;
    a front protective member provided on said front edge of said base plate for protecting the front of a cabinet supposed on said platform, and
    elastic protruding members that are provided on said contact surface of said base plate and are adapted to fit into depressions formed in a cabinet base surface,
    wherein said front protective member is formed in a shape of an angular pillar on a side thereof.

10. The cabinet support platform as described in claim 8, wherein said front protective member has a cross-section which is a right triangle and is provided so that a sloping face part thereof is on the front of the front protective member.

11. The cabinet support platform as described in claim 1, wherein said base plate is shaped to provide an opening between a central portion of said base plate and a cabinet when a cabinet is placed on said platform.

12. The cabinet support platform as described in claim 11, wherein said base place further comprises a roughly "V"-shaped cross sectional shape.

13. A cabinet support platform adapted to support a cabinet of an electronic device, comprising:
    a base plate adapted to support a cabinet base surface, said base plate having a front edge and a contact surface;
    a front protective member provided on said front edge of said base plate for protecting the front of a cabinet supported on said platform, and
    elastic protruding members that are provided on said contact surface of said base plate and are adapted to fit into depressions formed in a cabinet base surface,
    wherein said base plate is shaped to provide an opening between a central portion of said base plate and a cabinet when a cabinet is placed on said platform, and
    wherein said base plate further comprises a roughly "V"-shaped cross sectional shape.

* * * * *